US012647093B2

(12) United States Patent
Wu et al.

(10) Patent No.: US 12,647,093 B2
(45) Date of Patent: Jun. 2, 2026

(54) BALUN AND SIGNAL CONVERSION METHOD FROM UNBALANCED TO BALANCED

(71) Applicant: REALTEK SEMICONDUCTOR CORP., Hsinchu (TW)

(72) Inventors: Yi-Ching Wu, Hsinchu (TW); Chia-Jun Chang, Hsinchu (TW)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 88 days.

(21) Appl. No.: 18/733,157

(22) Filed: Jun. 4, 2024

(65) Prior Publication Data

US 2025/0141422 A1     May 1, 2025

(30) Foreign Application Priority Data

Oct. 25, 2023    (TW) ................................. 112140931

(51) Int. Cl.
*H03H 7/42*          (2006.01)
(52) U.S. Cl.
CPC ..................................... *H03H 7/42* (2013.01)
(58) Field of Classification Search
CPC ..... H03H 7/42; H03H 7/09; H03H 2001/0085

USPC ................................................... 333/175, 185
See application file for complete search history.

(56) References Cited

U.S. PATENT DOCUMENTS

| | | | |
|---|---|---|---|
| 2009/0195324 A1 | 8/2009 | Li et al. | |
| 2010/0060376 A1 | 3/2010 | Shyu | |
| 2010/0194498 A1* | 8/2010 | Isoshima | H03H 7/1725 |
| | | | 29/846 |
| 2020/0119709 A1 | 4/2020 | Shiokawa | |

FOREIGN PATENT DOCUMENTS

WO     WO 2023/051837 A1     4/2023

* cited by examiner

*Primary Examiner* — Jorge L Salazar, Jr.
(74) *Attorney, Agent, or Firm* — Birch, Stewart, Kolasch & Birch, LLP

(57) ABSTRACT

A balun includes a first coil, a second coil, a third coil, a fourth coil, and a capacitor. The first coil is coupled between an unbalanced pin and a first ground terminal. The second coil is coupled between the first ground terminal and a second ground terminal. The third coil is coupled between a first balanced pin and a connection point and is inductively coupled to the first coil. The fourth coil is coupled between the connection point and a second balanced pin and is inductively coupled to the second coil. The capacitor is coupled between the connection point and a third ground terminal.

18 Claims, 7 Drawing Sheets

100

110

120

BALUN AND SIGNAL CONVERSION METHOD FROM UNBALANCED TO BALANCED

CROSS-REFERENCE TO RELATED APPLICATION

This non-provisional application claims priority under 35 U.S.C. § 119 (a) to patent application No. 112140931 filed in Taiwan, R.O.C. on Oct. 25, 2023, the entire contents of which are hereby incorporated by reference.

BACKGROUND

Technical Field

The present application relates to a balun. In particular, according to one or some embodiments, the present application relates to a balun and a conversion method from unbalanced to balanced that can have good performance over a wide operating frequency band.

Related Art

The external digital pre-distortion (eDPD) circuit usually has a wide operating frequency band. Furthermore, the signal-to-interference ratio (SIR) is one of the important indicators for the eDPD circuit.

Generally, the eDPD circuit is provided with a balun to perform a signal conversion. Since the single balun known to the inventor cannot be applied to the wide operating frequency band, a general approach is to configure baluns for respective small frequency bands in the wide operating frequency band, such that the eDPD circuit would have a better SIR. However, this approach takes up too much area in the wafer.

SUMMARY

In an embodiment, a balun includes a first coil, a second coil, a third coil, a fourth coil, and a capacitor. The first coil is coupled between an unbalanced terminal and a first ground terminal. The second coil is coupled between the first ground terminal and a second ground terminal. The third coil is coupled between a first balanced terminal and a connection point, and the third coil is inductively coupled to the first coil. The fourth coil is coupled between the connection point and a second balanced terminal, and the fourth coil is inductively coupled to the second coil. The capacitor is coupled between the connection point and a third ground terminal.

In an embodiment, a signal conversion method from unbalanced to balanced includes: receiving an input signal by using an unbalanced terminal of a balun, wherein the balun includes a first coil, a second coil, a third coil, a fourth coil, and a capacitor, the first coil is coupled between the unbalanced terminal and a first ground terminal, the second coil is coupled between the first ground terminal and a second ground terminal, the third coil is coupled between a first balanced terminal and a connection point of the balun and is inductively coupled to the first coil, the fourth coil is coupled between the connection point and a second balanced terminal of the balun and is inductively coupled to the second coil, and the capacitor is coupled between the connection point and a third ground terminal; and generating a differential signal pair on the first balanced terminal and the second balanced terminal according to the input signal by using the third coil and the fourth coil.

To sum up, by applying the balun and the signal conversion method from unbalanced to balanced of one or some embodiments of the present application, a single balun can be used to perform signal conversion under the wide operating frequency band, and the balun can also have better numerical performance of common mode rejection ratio (CMRR) than a balun without an intermediate grounding architecture.

Detailed features and advantages of the present application are described in detail in the following implementations, and the content of the implementations is sufficient for a person skilled in the art to understand and implement the technical content of the present application. A person skilled in the art can easily understand the objectives and advantages related to the present application according to the contents disclosed in this specification, the claims and the drawings.

BRIEF DESCRIPTION OF THE DRAWINGS

The instant disclosure will become more fully understood from the detailed description given herein below for illustration only and therefore not limitative of the instant disclosure, wherein.

DETAILED DESCRIPTION

To make the objectives, features, and advantages of the embodiments of the present application more comprehensible, the following provides detailed descriptions with reference to the accompanying drawings.

It should be understood that the terms "comprises", "comprising", "includes" and/or "including", when used herein, specify the presence of stated features, integers, steps, operations, elements, and/or components, but do not preclude the presence or addition of one or more other features, integers, steps, operations, elements, components, and/or groups thereof.

Figure 1:
FIG. 1 illustrates a schematic view of a balun according to an embodiment of the present application.

FIG. 1 illustrates a schematic view of a balun 100 according to an embodiment of the present application. Please refer to FIG. 1. The balun 100 converts a single-ended signal into a dual-ended signal by implementing a signal conversion method from unbalanced to balanced of one or some embodiments of the present application. In some embodiments, the balun 100 has a wide operating frequency band and can have good performance in this wide operating frequency band. In some implementations, the width of the operating frequency band may be approximately 5.5 GHz. In these implementations, the operating frequency band of the balun 100 can be determined according to a usage frequency band of a circuit to which the balun 100 is applied. For example, the operating frequency band may be in a range between 2 GHZ and 7.5 GHz with a center frequency being 5 GHZ.

In some embodiments, the balun 100 includes an unbalanced port 110 and a balanced port 120, and the unbalanced port 110 and the balanced port 120 are inductively coupled to each other. The unbalance port 110 has an unbalanced terminal P1, and the balanced port has two balanced terminals (hereinafter, referred to as a first balanced terminal P2 and a second balanced terminal P3, respectively).

In some embodiments, the unbalanced port 110 may include a first coil 111 and a second coil 112. The first coil 111 is coupled between the unbalanced terminal P1 and a first ground terminal G1. The second coil 112 is coupled between the first ground terminal G1 and a second ground terminal G2. Furthermore, the balanced port 120 may include a third coil 121, a fourth coil 122, and a capacitor 123. The third coil 121 is coupled between the first balanced terminal P2 and a connection point N1. The fourth coil 122 is coupled between the connection point N1 and the second balanced terminal P3. The capacitor 123 is coupled between the connection point N1 and a third ground terminal G3.

In some embodiments, the third coil 121 may be arranged opposite to the first coil 111, so that the third coil 121 can be inductively coupled to the first coil 111. The fourth coil 122 may be arranged opposite to the second coil 112, so that the fourth coil 122 can be inductively coupled to the second coil 112. Furthermore, in some embodiments, the first ground terminal G1, the second ground terminal G2, and the third ground terminal G3 may be electronically connected to different ground signals; or in some other embodiments, the first ground terminal G1, the second ground terminal G2, and the third ground terminal G3 may be all electronically connected to the same ground signal. In some implementations, the ground signal is 0 volt.

Figure 2:
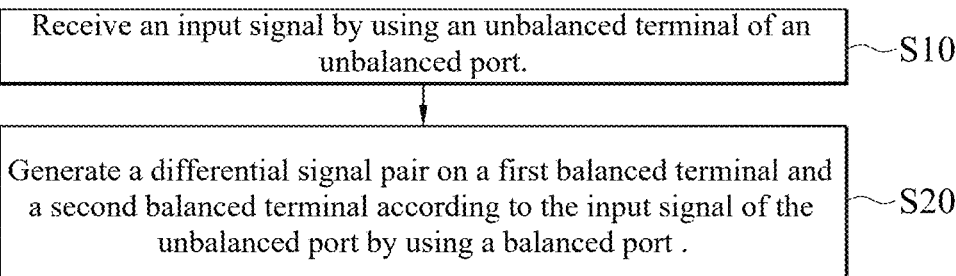
FIG. 2 illustrates a schematic flowchart of a signal conversion method from unbalanced to balanced according to an embodiment of the present application.

FIG. 2 illustrates a schematic flowchart of a signal conversion method from unbalanced to balanced according to an embodiment of the present application. Please refer to FIG. 1 and FIG. 2. In an embodiment, the balun 100 can receive an input signal S1 from a pre-stage circuit (not shown) by using the unbalanced terminal P1 of the unbalanced port 110 (step S10). Through the inductively coupling between the third coil 121 and the first coil 111 and the inductively coupling between the fourth coil 122 and the second coil 112, the balanced port 120 can generate a differential signal pair D1 on the first balanced terminal P2 and the third balanced terminal P3 according to the input signal S1 on the unbalanced port 110 (step S20), and the balanced port 120 can also output the differential signal pair D1 to a post-stage circuit (not shown) through the first balanced terminal P2 and the second balanced terminal P3. In some embodiments, the differential signal pair D1 includes a first differential signal D11 and a second differential signal D12. In these embodiments, the first differential signal D11 can be output to the post-stage circuit through the first balanced terminal P2 of the balanced port 120, and the second differential signal D12 can be output to the post-stage circuit through the second balanced terminal P3 of the balanced port 120.

In some implementations, the pre-stage circuit may include, but not limited to, a coupler used to collect micro signals from an antenna. Furthermore, the pre-stage circuit may further include an attenuator, and the attenuator is coupled between the coupler and the unbalanced terminal P1 of the unbalanced port 110. In some implementations, the post-stage circuit may include, but not limited to, an external digital pre-distortion (eDPD) circuit.

In some embodiments, through the directly intermediate grounding architecture of the unbalanced port 110 (i.e., coupled to the first ground terminal G1) and the indirectly intermediate grounding architecture of the balanced port 120 (i.e., the connection point N1 is coupled to the third ground terminal G3 through the capacitor 123) of the balun 100, an amplitude imbalance of the differential signal pair D1, converted and output by the balun 100, can be close to an ideal value of 0 dB under the wide operating frequency band (e.g., the maximum amplitude imbalance under the operating frequency band is 0.02 dB), and an phase imbalance of the differential signal pair D1 can be close to an ideal value (i.e., 180.0 degrees) under the wide operating frequency band (e.g., the phase imbalance of the differential signal pair D1 is 180±2.0 degrees). For example, a variation range of the phase imbalance is within 3 degrees. In this way, under the wide operating frequency band, the numerical performance of a common-mode rejection ratio (CMRR) of the balun 100 according to one or some embodiments of the present application can be better than a balun without intermediate grounding architecture in either port or in both ports.

In some embodiments, a capacitance of the capacitor 123 may be determined according to the operating frequency band of the balun 100. For example, by choosing the capacitor 123 with an appropriate capacitance, the balun 100 can have the best performance at a center frequency in the operating frequency band (e.g., the phase imbalance of the differential signal pair D1 is closest to the ideal value of 180.0 degrees at the center frequency). In some implementations, the capacitance of the capacitor 123 may be in a range of 10 Farads (F) to 100 Farads. In some implementations, the capacitance of the capacitor 123 may be 10 Farads. In other implementations, the capacitance of the capacitor 123 may be 20 Farads.

Figure 3:
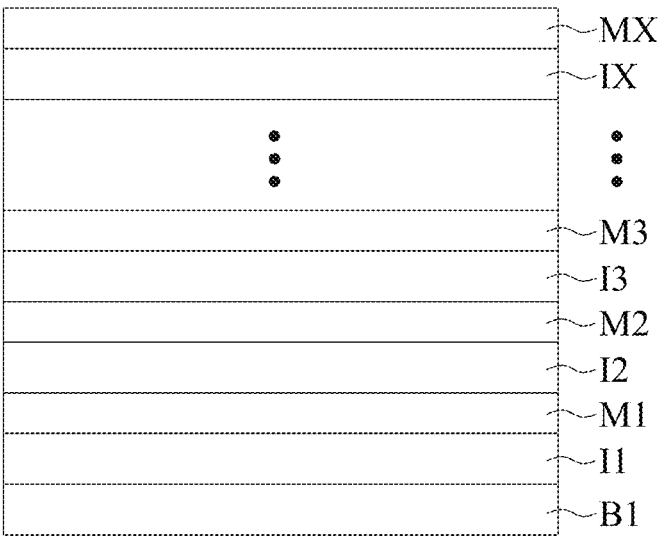
FIG. 3 illustrates a cross-sectional schematic view of an integrated structure for manufacturing a balun according to an embodiment of the present application.

FIG. 3 illustrates a cross-sectional schematic view of an integrated structure for manufacturing a balun 100 according to an embodiment of the present application. Please refer to FIG. 3. In some embodiments, an integrated structure for manufacturing the balun 100 includes a substrate B1 and a plurality of isolation layers I1-IX, wherein, X is a positive integer greater than 1. In these embodiments, the plurality of isolation layers I1-IX is sequentially stacked one another on the substrate B1, and each of the plurality of isolation layers I1-IX has a metal layer. In other words, in these embodiments, X metal layers M1-MX may be totally provided and sequentially stacked one another on the substrate B1, and any two adjacent metal layers in the metal layers M1-MX are separated by one isolation layer. For example, the metal layer M3 and the metal layer M2 are separated by the isolation layer I3.

Figure 4:
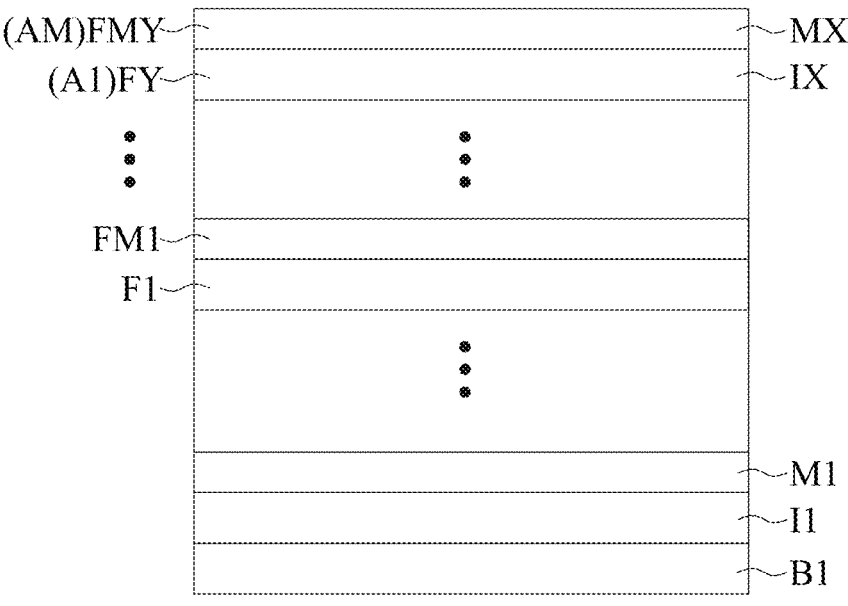
FIG. 4 illustrates a cross-sectional schematic view of an integrated structure for manufacturing a balun according to an embodiment of the present application.

FIG. 4 illustrates a cross-sectional schematic view of an integrated structure for manufacturing a balun 100 according to an embodiment of the present application. Please refer to FIG. 1 and FIG. 4. In some embodiments, the first coil 111, the second coil 112, and one of the third coil 121 and the fourth coil 122 are formed on a specific isolation layer A1 in the plurality of isolation layers I1-IX. In these embodiments, the specific isolation layer A1 is one of the plurality of isolation layers I1-IX. Furthermore, the other one of the third coil 121 and the fourth coil 122 is formed on a plurality of intermediate isolation layers F1-FY in the plurality of isolation layers I1-IX. In these embodiments, each of the plurality of intermediate isolation layers F1-FY is one of the plurality of isolation layers I1-IX.

In some embodiments, the plurality of intermediate isolation layers F1-FY are continuously stacked one another. In other words, in some embodiments, no other isolation layer may be provided between the plurality of intermediate isolation layers F1-FY. In some embodiments, one of the plurality of intermediate isolation layers F1-FY is the specific isolation layer A1. In some implementations, the specific isolation layer A1 is the intermediate isolation layer FY which is at an uppermost portion of the plurality of intermediate isolation layers F1-FY. For example, in the case that four intermediate isolation layers F1-F4 are provided in total, the specific isolation layer A1 is the intermediate isolation layer F4.

Figure 5:
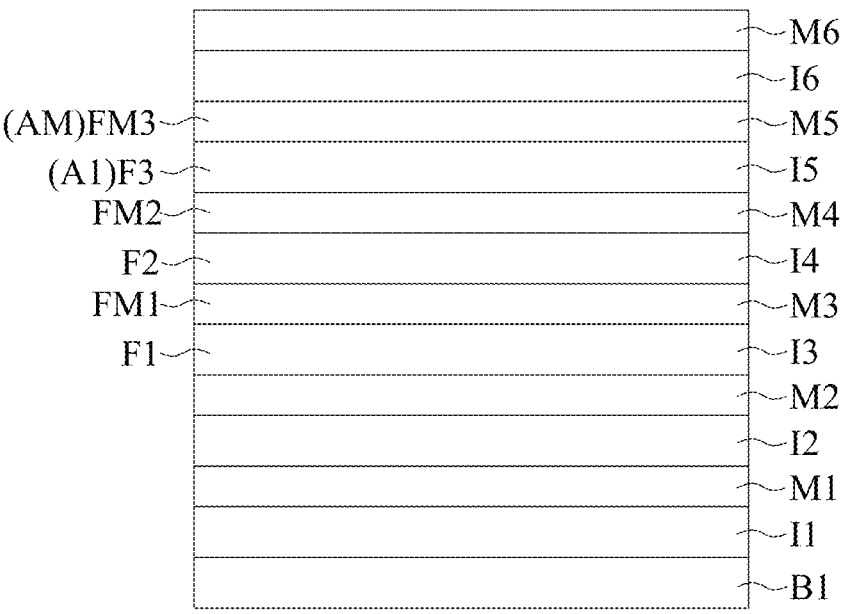
FIG. 5 illustrates a cross-sectional schematic view of an integrated structure for manufacturing a balun according to an embodiment of the present application.

In some implementations, as shown in FIG. 4, the specific isolation layer A1 is the uppermost layer in the plurality of isolation layers I1-IX, that is, the isolation layer IX, and the intermediate isolation layer FY is also the isolation layer IX. In other implementations, the specific isolation layer A1 may not be the uppermost layer in the plurality of isolation layers I1-IX. For example, as shown in FIG. 5, in the case that X is 6 and Y is 3, five isolation layers I1-I5 may be totally provided on the substrate B1, and three of the isolation layers, for example, the isolation layers I3-I5 may be the intermediate isolation layers F1-F3. In this example, the specific isolation layer A1 may be the isolation layer I5 in the isolation layers I1-I6, and the specific isolation layer A1 may also be the intermediate isolation layer F3 which is at an uppermost portion of the intermediate isolation layers F1-F3.

Please refer again to FIG. 1 and FIG. 4. In some embodiments, the first coil 111, the second coil 112, and the fourth coil 122 are formed on the specific isolation layer A1, and the third coil 121 is formed on the plurality of intermediate isolation layers F1-FY. In other words, in some embodiments, the first coil 111, the second coil 112, and the fourth coil 122 are configured by the metal layer AM on the specific isolation layer A1, and the third coil 121 is configured by a plurality of metal layers FM1-FMY on the plurality of intermediate isolation layers F1-FY.

In some embodiments, depending on the resistance for the first coil 111, the second coil 112, and the fourth coil 122, one of the metal layers M1-MX may be selected to perform the configuration. Furthermore, depending on the resistance for the third coil 121, the number of layers of the plurality of metal layers FM1-FMY are used to perform the configuration is determined.

In some implementations, the configuration patterns of the third coil 121 on each of the plurality of metal layers FM1-FMY of the plurality of intermediate isolation layers F1-FY may be substantially the same (i.e., a vertical projection of the configuration pattern on each of the plurality of metal layers FM1-FMY in a Z-axis direction may overlap one another), and the configuration pattern on each of the plurality of metal layers FM1-FMY of the plurality of intermediate isolation layers F1-FY may be connected to an adjacent configuration pattern through at least one corresponding via. Taking the intermediate isolation layers F1-F3 as an example, the configuration pattern on the metal layer FM2 of the intermediate isolation layer F2 can be connected to the configuration pattern on the metal layer FM1 of the intermediate isolation layer F1 by passing through the at least one via of the intermediate isolation layer F2, and the configuration pattern on the metal layer FM3 of the intermediate isolation layer F3 can be connected to the configuration pattern on the metal layer FM2 of the intermediate isolation layer F2 by passing through the at least one via of the intermediate isolation layer F3.

In some embodiments, the specific isolation layer A1 is the Nth isolation layer counting upward from the lowest layer (i.e., the isolation layer I1) in the plurality of isolation layers I1-IX. Furthermore, the plurality of intermediate isolation layers F1-FY are the (N−2)th isolation layer to the Nth isolation layer counting upward from the lowest layer (i.e., the isolation layer I1) in the plurality of isolation layers I1-IX. In these embodiments, N is a positive integer greater than 2 and less than or equal to X. Y is the number of the intermediate isolation layers. In these embodiments, Y is 3. For example, as shown in FIG. 5, X is 6 and N is 5 in this example, the isolation layer I5 in the isolation layers I1-I6 is the specific isolation layer A1, and the isolation layers I3-I5 are the intermediate isolation layers F1-F3.

Figure 6:
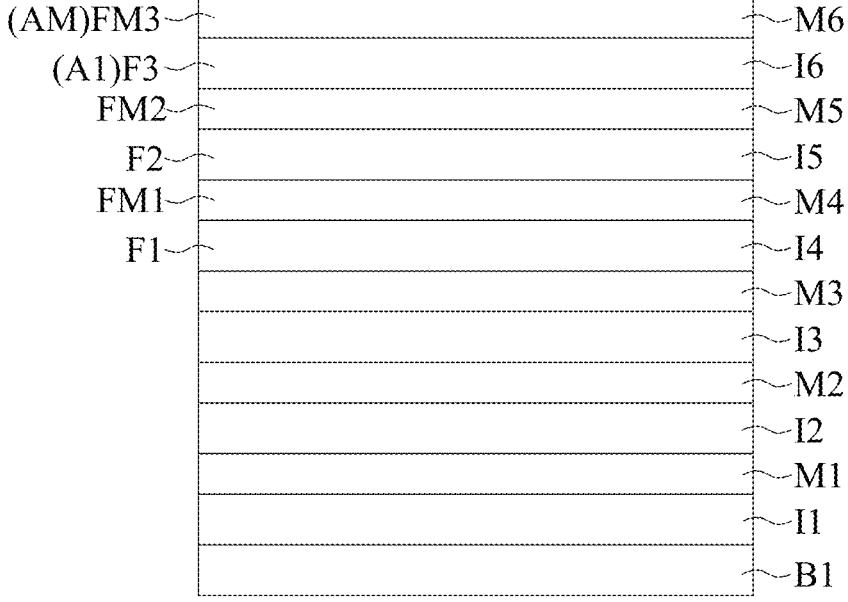
FIG. 6 illustrates a cross-sectional schematic view of an integrated structure for manufacturing a balun according to an embodiment of the present application.

In some implementations, X may be 6, N may be 6, and Y may be 3. For example, as shown in FIG. 6, the 6th isolation layer I6 in the isolation layers I1-I6 may be the specific isolation layer A1, and the 4th isolation layer I4 to the 6th isolation layer I6 are the intermediate isolation layers F1-F3. Taking an example that the first coil 111, the second coil 112, and the fourth coil 122 are formed on the specific isolation layer A1, and the third coil 121 is formed on the intermediate isolation layers F1-F3, the first coil 111, the second coil 112, and the fourth coil 122 are configured by the metal layer M6 on the isolation layer I6, and the third coil 121 is configured by the metal layers M4-M6 on the isolation layers I4-I6. In this example, each of the isolation layer I5 and isolation layer I6 includes at least one via, so that the configuration pattern of the third coil 121 on the metal layer M5 can be connected to the configuration pattern of the third coil 121 on the metal layer M4 by passing through the at least one via on the isolation layer I5, and the configuration pattern of the third coil 121 on the metal layer M6 can be connected to the configuration pattern of the third coil 121 on the metal layer M5 by passing through the at least one via on the isolation layer I6.

Please refer to FIG. 1 and FIG. 4. In some embodiments, a first configuration length of the first coil 111 on a metal layer AM of the specific isolation layer A1 may be substantially equal to a second configuration length of the second coil 112 on the metal layer AM of the specific isolation layer A1. In other words, in some embodiments, a signal path length between the unbalanced terminal P1 and the first ground terminal G1 is substantially equal to a signal path length between the second ground terminal G2 and the first ground terminal G1.

In some other embodiments, the first configuration length of the first coil 111 on the metal layer AM of the specific isolation layer A1 may be close to but different from the second configuration length of the second coil 112 on the metal layer AM of the specific isolation layer A1. In other words, in some embodiments, the signal path length between the unbalanced terminal P1 and the first ground terminal G1 may be different from the signal path length between the second ground terminal G2 and the first ground terminal G1. In some implementations, a difference between the first configuration length of the first coil 111 and the second configuration length of the second coil 112 is less than or equal to 5%.

In some embodiments, taking an example that the fourth coil 122 is formed on the specific isolation layer A1 and the third coil 121 is formed on the plurality of intermediate isolation layers F1-FY, a fourth configuration length of the fourth coil 122 on the metal layer AM of the specific isolation layer A1 may be substantially equal to a third configuration length of the third coil 121 on the metal layer of one of the plurality of intermediate isolation layers F1-FY (e.g., the metal layer FMY of the intermediate isolation layer FY). In other words, in some embodiments, a signal path length between the first balanced terminal P2 and the connection point N1 is substantially equal to a signal path length between the second balanced terminal P3 and the connection point N1.

In other embodiments, the fourth configuration length of the fourth coil 122 on the metal layer AM of the specific isolation layer A1 may be different from the third configuration length of the third coil 121 on the metal layer of one of the plurality of intermediate isolation layers F1-FY (e.g., the metal layer FMY of the intermediate isolation layer FY). In other words, in some embodiments, the signal path length between the first balanced terminal P2 and the connection point N1 may be different from the signal path length between the second balanced terminal P3 and the connection point N1. In some implementations, a difference between the third configuration length of the third coil 121 and the fourth configuration length of the fourth coil 122 is less than or equal to 5%.

For example, the first coil 111, the second coil 112, and the fourth coil 122 are configured by the metal layer M6 on the isolation layer I6, the third coil 121 is configured by the metal layers M4-M6 on the isolation layer I4-I6, and the operating frequency band is 2 GHZ to 7.5 GHZ. In this example, the CMRR is calculated according to the following formula: (2+amplitude imbalance)/[(amplitude imbalance)^2+(phase imbalance)^2]^0.5.

In this case, the signal characteristics of the differential signal pair D1 of one implementation of the balun 100 (as shown in FIG. 1) are as follows: at 2 GHZ, the amplitude imbalance is 1.536 dB, the phase imbalance is 178.7 degrees, and the CMRR is 8.11; at 2.5 GHz, the amplitude imbalance is 1.528 dB, the phase imbalance is 179.2 degrees, and the CMRR is 6.95; at 5 GHZ, the amplitude imbalance is 1.505 dB, the phase imbalance is 180.7 degrees, and the CMRR is 4.80; at 6 GHZ, the amplitude imbalance is 1.506 dB, the phase imbalance is 181.1 degrees, and the CMRR is 4.48; and at 7.5 GHZ, the amplitude imbalance is 1.516 dB, the phase imbalance is 181.7 degrees, and the CMRR is 4.28. In this implementation, a configuration length (i.e., signal trace length) ratio of the first coil 111 and the second coil 112 is 1:1, and a configuration length ratio of the third coil 121 and the fourth coil 122 is 1:1.

In other words, in some embodiments, in the operating frequency band of 2 GHZ to 7.5 GHZ, the phase imbalance of the differential signal pair D1 generated on the first balanced terminal P2 and the second balanced terminal P3 are all within 180.0±1.7 degrees (i.e., 181.7−180.0=1.7, and 180.0−178.7=1.3), and a variation range of the phase imbalance does not exceed 3 degrees (i.e., 181.7−178.7=3). Furthermore, the CMRR of the balun 100 in the operating frequency band of 2 GHz to 7.5 GHz is in a range between 4.2 and 8.2.

Figures 7, 8:
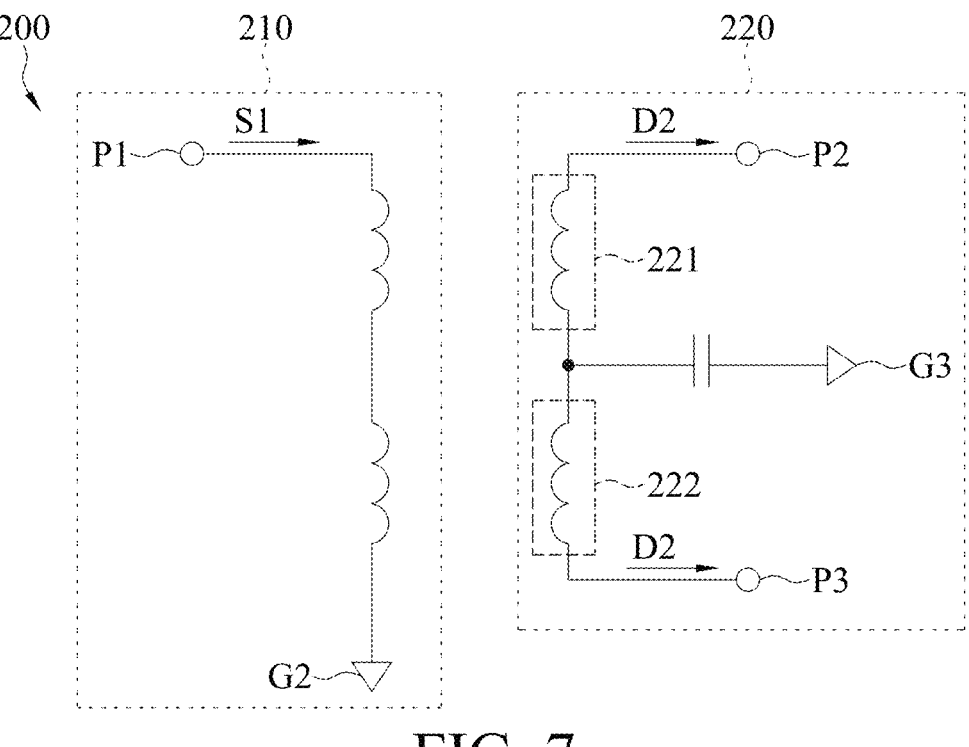
FIG. 7 illustrates a schematic view of a balun according to an embodiment of the present application.
FIG. 8 illustrates a schematic view of a balun according to an embodiment of the present application.

In an embodiment, the signal characteristics of a differential signal pair D2 of a balun 200 without an intermediate grounding architecture in an unbalanced port 210 (as shown in FIG. 7, the balanced port 220 has an indirectly intermediate grounding architecture) are as follows: at 2 GHz, the amplitude imbalance is 2.63 dB, and the phase imbalance is 123.2 degrees; at 2.5 GHz, the amplitude imbalance is 2.76 dB, and the phase imbalance is 133.5 degrees; at 5 GHz, the amplitude imbalance is 2.93 dB, and the phase imbalance is 157.1 degrees; at 6 GHZ, the amplitude imbalance is 2.92 dB, and the phase imbalance is 161.6 degrees; and at 7.5 GHZ, the amplitude imbalance is 2.89 dB, and the phase imbalance is 166.5 degrees. In this embodiment, a configuration length ratio of a third coil 221 and a fourth coil 222 is 1:1.

In an embodiment, the signal characteristics of a differential signal pair D3 of a balun 300 without an intermediate grounding architecture in a balanced port 320 (as shown in FIG. 8, the unbalanced port 310 has a directly intermediate grounding architecture) are as follows: at 2 GHz, the amplitude imbalance is 3.01 dB, and the phase imbalance is 161.6 degrees; at 2.5 GHZ, the amplitude imbalance is 2.69 dB, and the phase imbalance is 161.1 degrees; at 5 GHz, the amplitude imbalance is 1.22 dB, and the phase imbalance is 159.82 degrees; at 6 GHZ, the amplitude imbalance is 0.746 dB, and the phase imbalance is 159.99 degrees; and at 7.5 GHz, the amplitude imbalance is 0.140 dB, and the phase imbalance is 160.69 degrees. In this embodiment, a configuration length ratio of a first coil 311 and a second coil 312 is 1:1.

Figure 9:
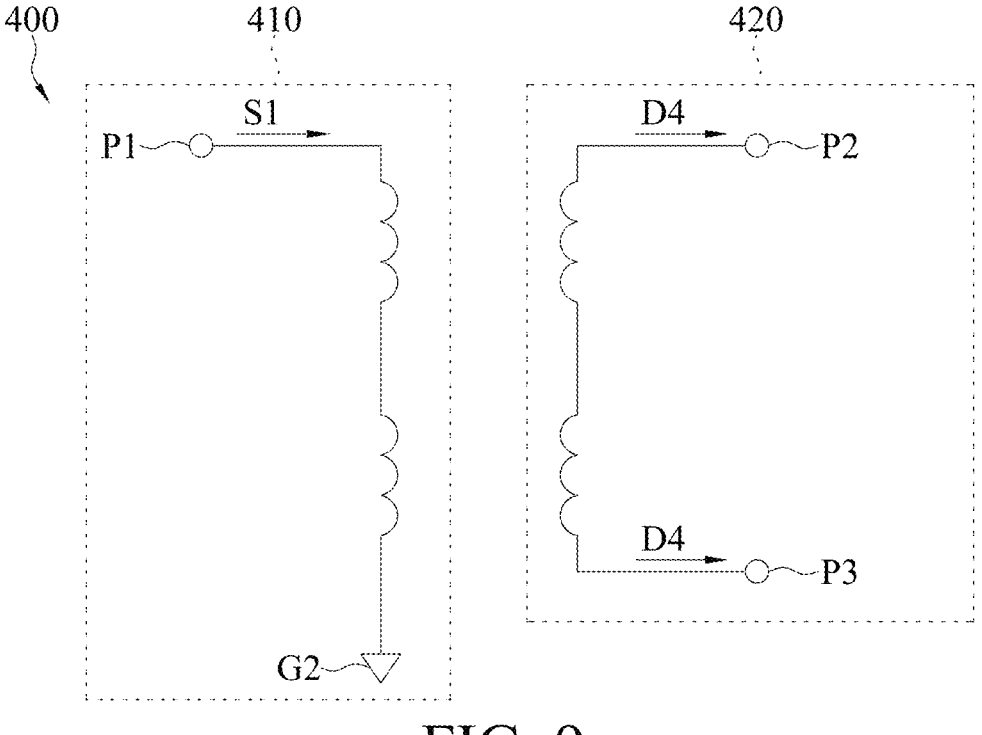
FIG. 9 illustrates a schematic view of a balun according to an embodiment of the present application.

In an embodiment, the signal characteristics of the differential signal pair D4 of a balun 400 without an intermediate grounding architecture in both unbalanced port 410 and balanced port 420 (as shown in FIG. 9) are as follows: at 2 GHZ, the amplitude imbalance is 0.185 dB, the phase imbalance is 194.7 degrees, and the CMRR is 7.77; at 2.5 GHZ, the amplitude imbalance is 0.189 dB, the phase imbalance is 198.3 degrees, and the CMRR is 6.58; at 5 GHZ, the amplitude imbalance is 0.250 dB, the phase imbalance is 216.8 degrees, and the CMRR is 4.38; at 6 GHZ, the amplitude imbalance is 0.306 dB, the phase imbalance is 224.1 degrees, and the CMRR is 4.09; and at 7.5 GHZ, the amplitude imbalance is 0.441 dB, the phase imbalance is 235.1 degrees, and the CMRR is 3.91.

As a result, compared with the balun 200, balun 300, and balun 400 that is devoid of an intermediate grounding architecture in at least one port, the phase imbalance of the differential signal pair D1 generated by the balun 100 in the wide operating frequency band are all quite close to 180.0 degrees. Furthermore, the numerical performance of the CMRR of the balun 100 under the wide operating frequency band are all better than the numerical performance of the balun 400 without an intermediate grounding architecture in both ports.

Figure 10:
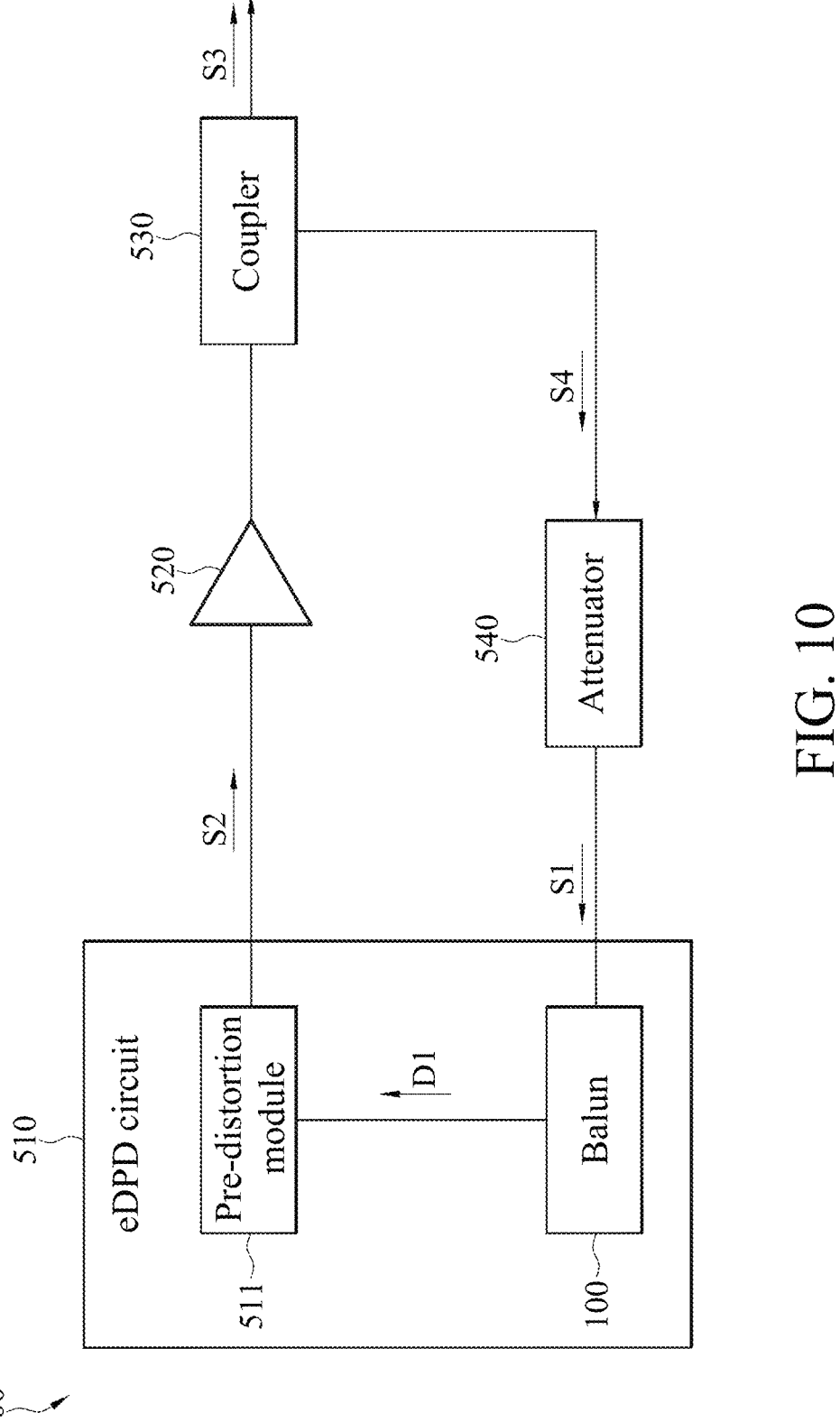
FIG. 10 illustrates a schematic view of a communication circuit according to an embodiment of the present application.

FIG. 10 illustrates a schematic view of a communication circuit 500 according to an embodiment of the present application. Please refer to FIG. 1 and FIG. 10. The balun 100 according to any of the aforementioned implementations can be applied in the communication circuit 500. In some embodiments, the communication circuit 500 includes an external digital pre-distortion (eDPD) circuit 510, a power amplifier 520, a coupler 530, and an attenuator 540. In these embodiments, the eDPD circuit 510 includes a pre-distortion module 511 and the balun 100.

An input terminal of the power amplifier 520 is coupled to an output terminal of the pre-distortion module 511 of the eDPD circuit 510 to receive a pre-distortion signal S2. The power amplifier 520 amplifies the pre-distortion signal S2 into a radio frequency signal S3. An input terminal of the coupler 530 is coupled to an output terminal of the power amplifier 520 to receive the radio frequency signal S3 from the power amplifier 520. The coupler 530 is configured to output the radio frequency signal S3 to an antenna (not shown) and to generate a coupling signal S4 according to the radio frequency signal S3. In some embodiments, the coupling signal S4 is a trace amount of the radio frequency signal S3. An input terminal of the attenuator 540 is coupled to the coupler 530 to receive the coupling signal S4 from the coupler 530. The attenuator 540 is configured to attenuate the coupling signal S4 into an input signal S1. The unbalanced port 110 of the balun 100 is coupled to an output terminal of the attenuator 540 to receive the input signal S1 from the attenuator 540. The balun 100 converts a differential signal pair D1 on the balanced port 120 according to the input signal S1 on the unbalanced port 110. An input terminal of the pre-distortion module 511 is coupled to the balanced port 120 of the balun 100 to receive the differential signal pair D1 from the balun 100. The pre-distortion module 511 is configured to perform a pre-distortion processing according to the differential signal pair D1 to generate the pre-distortion signal S2.

In some implementations, the communication circuit 500 may be a communication chip manufactured by using an integrated circuit process.

To sum up, by applying the balun 100 and the signal conversion method from unbalanced to balanced of one or some embodiments of the present application, a single balun 100 can be used to perform signal conversion under the wide operating frequency band, and the balun 100 can also have better numerical performance of common mode rejection ratio (CMRR) than a balun without an intermediate ground architecture.

Although the present application has been described in considerable detail with reference to certain preferred embodiments thereof, the disclosure is not for limiting the scope of the application. Persons having ordinary skill in the art may make various modifications and changes without departing from the scope and spirit of the present application. Therefore, the scope of the appended claims should not be limited to the description of the preferred embodiments described above.

What is claimed is:

1. A balun, comprising:
a first coil coupled between an unbalanced terminal and a first ground terminal;
a second coil coupled between the first ground terminal and a second ground terminal;
a third coil coupled between a first balanced terminal and a connection point, wherein the third coil is inductively coupled to the first coil;
a fourth coil coupled between the connection point and a second balanced terminal, wherein the fourth coil is inductively coupled to the second coil; and
a capacitor coupled between the connection point and a third ground terminal;
wherein the first coil, the second coil, and one of the third coil and the fourth coil are formed on a specific isolation layer of a plurality of isolation layers which are sequentially stacked one another, the other one of the third coil and the fourth coil is formed on a plurality of intermediate isolation layers of the plurality of isolation layers, and one of the plurality of intermediate isolation layers is the specific isolation layer.

2. The balun according to claim 1, wherein the third coil is arranged opposite to the first coil, the fourth coil is arranged opposite to the second coil, the third coil is formed on the plurality of intermediate isolation layers, and the fourth coil is formed on the specific isolation layer.

3. The balun according to claim 2, wherein the specific isolation layer is a Nth layer from bottom to top in the plurality of isolation layers, and the plurality of intermediate isolation layers are a (N−2)th layer to the Nth layer from bottom to top in the plurality of isolation layers.

4. The balun according to claim 3, wherein N is 6.

5. The balun according to claim 1, wherein a first configuration length of the first coil is different from a second configuration length of the second coil.

6. The balun according to claim 5, wherein a difference between the first configuration length and the second configuration length is less than or equal to 5%.

7. The balun according to claim 1, wherein a third configuration length of the third coil is different from a fourth configuration length of the fourth coil.

8. The balun according to claim 7, wherein a difference between the third configuration length and the fourth configuration length is less than or equal to 5%.

9. The balun according to claim 1, wherein the balun has an operating frequency band, and a variation range of a phase imbalance of a differential signal pair on the first balanced terminal and the second balanced terminal in the operating frequency band does not exceed 3 degrees.

10. The balun according to claim 9, wherein a common mode rejection ratio (CMRR) of the balun in the operating frequency band is in a range between 4.2 and 8.2.

11. A signal conversion method from unbalanced to balanced, comprising:
receiving an input signal by using a unbalanced terminal of a balun, wherein the balun comprises a first coil, a second coil, a third coil, a fourth coil, and a capacitor, the first coil is coupled between the unbalanced terminal and a first ground terminal, the second coil is coupled between the first ground terminal and a second ground terminal, the third coil is coupled between a first balanced terminal of the balun and a connection point and is inductively coupled to the first coil, the fourth coil is coupled between the connection point and a second balanced terminal of the balun and is inductively coupled to the second coil, and the capacitor is coupled between the connection point and a third ground terminal; and
generating a differential signal pair on the first balanced terminal and the second balanced terminal according to the input signal by using the third coil and the fourth coil, wherein the first coil, the second coil, and one of the third coil and the fourth coil are formed on a specific isolation layer of a plurality of isolation layers which are sequentially stacked one another, the other one of the third coil and the fourth coil is formed on a plurality of intermediate isolation layers of the plurality of isolation layers, and one of the plurality of intermediate isolation layers is the specific isolation layer.

12. The signal conversion method from unbalanced to balanced according to claim 11, wherein the third coil is arranged opposite to the first coil, the fourth coil is arranged opposite to the second coil, the third coil is formed on the plurality of intermediate isolation layers, and the fourth coil is formed on the specific isolation layer.

13. The signal conversion method from unbalanced to balanced according to claim 12, wherein the specific isolation layer is a Nth layer from bottom to top in the plurality of isolation layers, and the plurality of intermediate isolation layers is a (N−2)th layer to the Nth layer from bottom to top in the plurality of isolation layers.

14. The signal conversion method from unbalanced to balanced according to claim 13, wherein N is 6.

15. The signal conversion method from unbalanced to balanced according to claim 11, wherein a first configuration length of the first coil is different from a second configuration length of the second coil.

16. The signal conversion method from unbalanced to balanced according to claim 11, wherein a third configuration length of the third coil is different from a fourth configuration length of the fourth coil.

17. The signal conversion method from unbalanced to balanced according to claim 11, wherein the balun has an operating frequency band, and a variation range of a phase imbalance of the differential signal pair on the first balanced terminal and the second balanced terminal in the operating frequency band does not exceed 3 degrees.

18. The signal conversion method from unbalanced to balanced according to claim 17, wherein a common mode rejection ratio (CMRR) of the balun in the operating frequency band is in a range between 4.2 and 8.2.

\* \* \* \* \*